United States Patent [19]

Jeng et al.

[11] Patent Number: 5,783,860
[45] Date of Patent: Jul. 21, 1998

[54] HEAT SINK BONDED TO A DIE PADDLE HAVING AT LEAST ONE APERTURE

[75] Inventors: Jian Dih Jeng, Hsinchu; Hsing Seng Wang, Tan-Yuan, both of Taiwan

[73] Assignee: Industrial Technology Research Institute, Hsinchu, Taiwan

[21] Appl. No.: 794,471

[22] Filed: Feb. 4, 1997

Related U.S. Application Data

[62] Division of Ser. No. 594,497, Jan. 31, 1996, Pat. No. 5,672,547.

[51] Int. Cl.$^6$ .................. H01L 23/495; H01L 23/10; H01L 23/34; H01L 23/28
[52] U.S. Cl. .................. 257/675; 257/676; 257/706; 257/783; 257/796
[58] Field of Search .................. 257/706, 675, 257/796, 676, 783

[56] References Cited

U.S. PATENT DOCUMENTS

| 3,930,114 | 12/1975 | Hodge | 437/902 |
|---|---|---|---|
| 4,758,927 | 7/1988 | Berg . | |
| 4,918,511 | 4/1990 | Brown . | |
| 5,139,973 | 8/1992 | Nagy et al. | 437/902 |
| 5,202,288 | 4/1993 | Doering et al. | 437/902 |
| 5,208,188 | 5/1993 | Newman | 437/209 |
| 5,345,106 | 9/1994 | Doering | 257/675 |
| 5,378,656 | 1/1995 | Kajihara et al. | 437/211 |
| 5,387,554 | 2/1995 | Liang | 437/214 |
| 5,429,992 | 7/1995 | Abbott et al. | 437/209 |
| 5,441,918 | 8/1995 | Morisaki et al. | 437/209 |
| 5,444,602 | 8/1995 | Banerjee et al. . | |
| 5,641,987 | 6/1997 | Lee | 257/675 |

FOREIGN PATENT DOCUMENTS

| 566872 | 10/1993 | European Pat. Off. | 257/675 |
|---|---|---|---|
| 59-207646 | 11/1984 | Japan | 257/675 |
| 2114658 | 4/1990 | Japan | 257/706 |
| 3030361 | 2/1991 | Japan | 257/706 |
| 4-48740 | 2/1992 | Japan | 437/902 |
| 4-115540 | 4/1992 | Japan | 437/902 |
| 4291749 | 10/1992 | Japan | 257/707 |
| 5129505 | 5/1993 | Japan | 257/676 |

*Primary Examiner*—T. M. Arroyo
*Attorney, Agent, or Firm*—Tung & Associates

[57] ABSTRACT

A method of bonding an integrated circuit die to a heat sink by first providing a lead frame that has a die paddle portion having a top surface, a bottom surface, and at least one aperture therethrough, positioning a heat sink abutting the bottom surface of the die paddle portion, and then pressing an integrated circuit die against the top surface of the die paddle portion with an adhesive material sandwiched therein between such that the adhesive flows through at least one aperture in the die paddle portion to bond the integrated circuit die and the heat sink together.

7 Claims, 3 Drawing Sheets

5,783,860

1

HEAT SINK BONDED TO A DIE PADDLE HAVING AT LEAST ONE APERTURE

This is a divisional of application Ser. No. 08/594,497 filed on Jan. 31, 1996, now U.S. Pat. No. 5,672,547.

FIELD OF THE INVENTION

The present invention generally relates to electronic device packaging and more particularly, relates to electronic device packaging for bonding an integrated circuit chip or for bonding a module containing more than one chip to a heat sink in a plastic encapsulation process.

BACKGROUND OF THE INVENTION

An important step in the manufacturing of integrated circuits is packaging during which an IC chip is encased in a metal, ceramic or plastic enclosure. A metal package or a ceramic package provides excellent heat dissipation properties, however, they are expensive and labor intensive packaging techniques. For instance, in a ceramic package, the use of two ceramic substrates represents a significant portion of the total cost of fabricating the IC device.

As the production volume for semiconductor devices grew, the development of more cost effective packages becomes increasingly important. One of such cost effective packages developed in recent years is a plastic molded package or sometimes called a plastic quad flat package (PQFP). Although a plastic molded package presents significant fabrication cost advantages, the desirable heat dissipation property that is inherent in a metal or ceramic package is lost. The shortcoming of the poor heat dissipation property in a plastic molded package becomes more severe in the more recently developed IC devices.

In modern IC devices, the density of a device has greatly increased. This is because in modern IC devices, the chip size has become smaller which means that the devices on the chip are being placed closer together. In order to maintain a reasonable service life of an IC device, the operating temperature of the device must be carefully controlled by providing adequate heat dissipation.

Another development in modern IC devices which further demands improved heat dissipation is the increasing use of higher power consumption circuits. For instance, in a conventional 208-pin PQFP device, only 1.0 watt power dissipation is required. The power dissipation, which is closely related to the heat dissipation property becomes more severe in a modern CPU or ASIC chip which requires 2-3 watts power dissipation capability. The heat dissipation property of a conventional plastic molded package therefore must be improved in order to accommodate the more densely packaged and the higher power consumption IC devices.

A heat sink, normally made of a high thermal conductivity material has been used to fulfill the need for improving heat dissipation in plastic molded packages. The heat sink is sometimes called a heat spreader when a surface of the heat sink is unexposed to the ambient, also called a heat slug when a surface of the heat sink is exposed to the ambient. A heat sink is typically made of a material that has a high thermal conductivity such as copper, copper alloys, aluminum, aluminum alloys or any other high thermal conductivity materials. The heat sink ideally should be in good thermal contact to a semiconductor die.

Attempts to improve the heat dissipation property of a plastic molded package have been made by others. One of such attempts is the use of adhesive tapes such as a polyamide tape between the die paddle and the heat sink. This is shown in FIG. 1. Polyimide tape 10 securely bonds die paddle 12 to heat sink 14. However, even though an intimate contact between the die paddle and the heat sink is achieved, the tape itself is a thermal insulator and therefore impedes the heat conduction between the die paddle and the heat sink. Moreover, the application of the tape also requires an additional processing step which is undesirable.

To improve the cooling efficiency of an integrated circuit encapsulated in a plastic molded package, an external add-on heat sink can be fixed tightly to the die paddle. This is shown in FIGS. 2a-2c. Such a package arrangement frequently includes an integrated circuit die 26 contained in a plastic molded package 28 by utilizing a lead-frame 20 provided with a die paddle 22 (also called die-attach or die-mounting paddle) to which the integrated circuit die 26 and the heat sink 24 are attached. A plastic molded package 28 is then molded around the lead frame 20 to encapsulate all the parts. During such an injection molding process, the die paddle 22 frequently bend away from the heat sink 24 which allows the injected plastic material to penetrate in between the die paddle 22 and the heat sink 24. The trapped plastic material acts as a heat insulator and deteriorates the heat dissipation property of the plastic molded package 28.

In yet another attempt to improve the heat dissipation between a die paddle and a heat sink, a vacuum passage is provided in the molding apparatus prior to the molding operation of the plastic molded package. This is shown in FIG. 3. In the molding apparatus 40, an integrated circuit die 42 is placed on a die paddle 44 prior to the closing of the mold. A vacuum is then applied through vacuum passage 46 to the underside of the die paddle 44 such that the die paddle is pressed tightly against the heat sink 48. A plastic injection process is then performed to encapsulate the device in plastic. The method is effective in achieving a tight contact between the die paddle and the heat sink. However, it requires complicated vacuum channels to be provided in the molding apparatus which greatly increases the tooling cost and furthermore, the cycle time for molding.

It is therefore an object of the present invention to provide a method of bonding a die paddle to a heat sink that does not have the drawbacks and the shortcomings of the prior art methods.

It is another object of the present invention to provide a method of bonding a die paddle to a heat sink in a plastic molded package that does not require the use of adhesive tapes.

It is a further object of the present invention to provide a method of bonding a die paddle to a heat sink in a plastic molded package that does not require the addition of any processing step to a conventional process.

It is another further object of the present invention to provide a method of bonding a die paddle to a heat sink in a plastic molded package without the need to modify existing processing apparatus.

It is yet another object of the present invention to process a method of bonding a die paddle to a heat sink in a plastic molded package that can be carried out by the same processing steps of a conventional molding process.

It is still another object of the present invention to provide a method of bonding a die paddle to a heat sink in a plastic molded package by providing at least one aperture in the die paddle.

It is still another further object of the present invention to provide a method of bonding a die paddle to a heat sink in a plastic molded package by providing apertures in the paddle and recessed areas in the surface of the heat sink that is in contact with the die paddle.

It is yet another further object of the present invention to provide a method of bonding a die paddle to a heat sink in a plastic molded package by providing apertures in the die paddle, recessed areas in the surface of the heat sink in contact with the die paddle, and a conductive adhesive bonding the die paddle and the heat sink together through the apertures.

It is still another further object of the present invention to provide an integrated circuit device in a plastic molded package wherein a die paddle is bonded to a heat sink by a conductive adhesive flown through apertures provided in the die paddle.

SUMMARY OF THE INVENTION

In accordance with the present invention, a method of bonding a heat sink to a die paddle in a plastic molded package by providing apertures in the die paddle such that an integrated circuit die, a die paddle, and a heat sink are bonded together securely in a die-bonding process. An adhesive filled with a conductive filler is normally used in the bonding process. The conductive filler added to the adhesive facilitates thermal conductivity between the integrated circuit die and the heat sink. The adhesive is an epoxy and filled with a metal powder, for instance, an epoxy filled with silver powder. The present invention bonding process can be carried out without the drawbacks and shortcomings of the prior art methods. For instance, it does not require the use of additional adhesive tapes to bond the die paddle to the heat sink, and it does not require the provision of vacuum channels in the molding apparatus in order to hold the die paddle securely against the heat sink. The process provides secure bonding between a die paddle and a heat sink by an adhesive flown through apertures provided in die paddle such that the plastic encapsulation material does not flow into a gap between the die paddle and the heat sink during a plastic encapsulation process. A plastic molded package that has superior heat dissipation property can thus be obtained.

In an alternate embodiment, recessed areas such as in the form of dimples in the surface of the heat sink facing the die paddle are provided. The recessed areas improve the adhesion between the die paddle and the heat sink by a locking action of the adhesive into the heat sink. Various configurations of the recessed areas can be designed to suit specific performance requirements. Normally, a simple recessed area such as a dimple is sufficient to achieve superior bonding between a die paddle and a heat sink. For more difficult bonding requirements, the recessed areas can be provided with an undercut to achieve maximum bonding or locking action between the die paddle and the heat sink.

The present invention is further directed to an integrated circuit device that is packaged in a plastic molded package wherein a die paddle is bonded to a heat sink by a conductive adhesive flown through apertures provided in the die paddle. The plastic molded package may contain a single IC device or a multiple number of IC devices. When multiple number of IC devices are mounted in a plastic molded package, the substrate is first securely bonded through apertures in the die paddle to a heat sink through the use of a conductive adhesive, the IC dies are then mounted to a substrate by a conductive adhesive.

BRIEF DESCRIPTION OF THE DRAWINGS

Other objects, features and advantages of the present invention will become apparent upon consideration of the specification and the appended drawings, in which.

DETAILED DESCRIPTION OF THE PREFERRED AND ALTERNATE EMBODIMENTS

The present invention provides a method of fabricating a plastic molded package that has superior heat dissipation property by first bonding an integrated circuit die to a heat sink with a die paddle portion of a lead frame sandwiched in between by flowing a conductive adhesive through apertures provided in the die paddle, and then encapsulate all the parts in a plastic molded package.

The present invention method of forming plastic molded packages can be used for either a single IC chip or for multiple IC chips. In the case of a multiple number of IC chips, the substrate is first bonded through apertures provided in a die paddle to a heat sink, then the chips are bonded to a substrate.

The present invention is described in a preferred embodiment and in several alternate embodiments. In the preferred embodiment, a heat sink having a flat (unrecessed) surface facing the die paddle is used. In one alternate embodiment, recessed areas are provided in the surface of the heat sink facing the die paddle at locations corresponding to the apertures in the die paddle. The recessed areas provide additional surface areas and thus additional bond strength through the bonding action with the IC die. In a second alternate embodiment, the substrate is first bonded by a conductive adhesive through apertures in the die paddle to a heat sink, a multiple number of ICs are then bonded by a conductive adhesive to a substrate.

In a third alternate embodiment, the heat sink has additional thickness such that the surface of the heat sink opposite to that bonded to the die paddle is exposed to ambient for additional heat dissipation capacity. The present invention further provides a plastic molded package that contains one or more IC dies that are bonded to a heat sink through a die paddle contained in a lead frame by flowing a conductive adhesive through apertures in the die paddle such that all three parts are securely bonded together. The plastic molded package fabricated by the present invention method provides superior heat dissipation properties.

Figure 1:
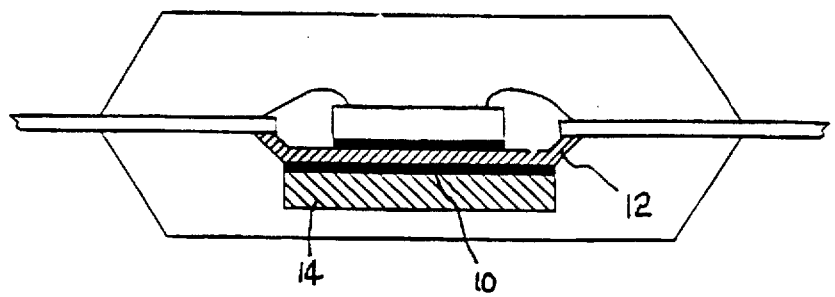
FIG. 1 is an enlarged cross-sectional view of a prior art plastic molded package utilizing adhesive tapes.
Figure 2A:
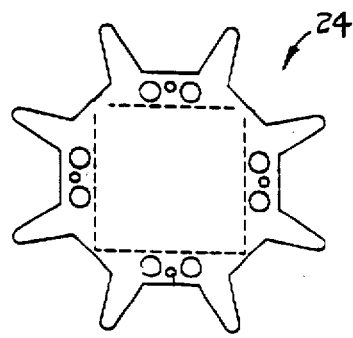
FIGS. 2a–2c are enlarged cross-sectional views of a second prior art method of using a heat sink equipped with dimples.
Figure 2B:
Figure 2C:
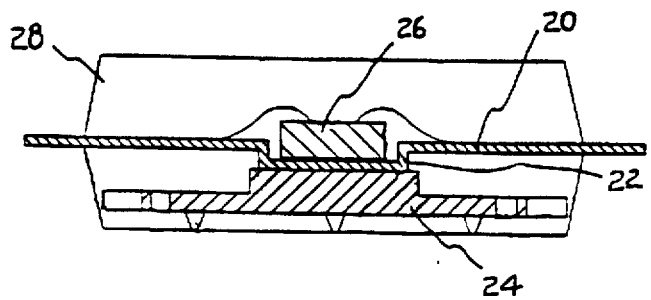
Figure 3:
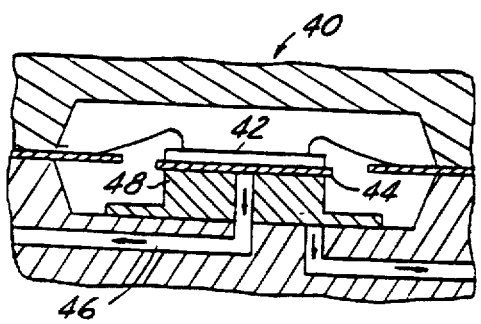
FIG. 3 is an enlarged cross-sectional view of a third prior art method in which a molding apparatus equipped with vacuum channels is used.
Figure 4:
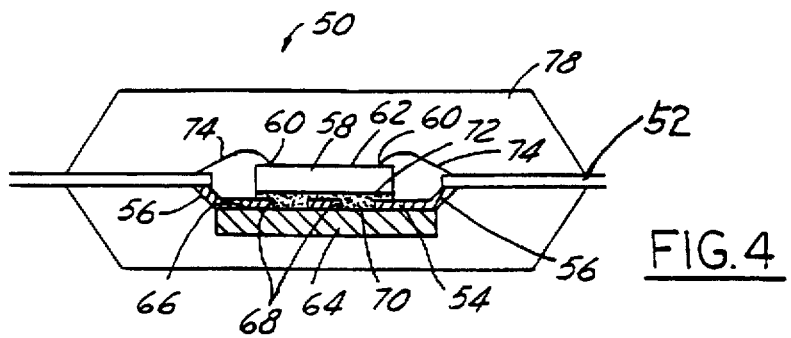
FIG. 4 is an enlarged cross-sectional view of the present invention bonding method in a preferred embodiment.
Figure 4A:
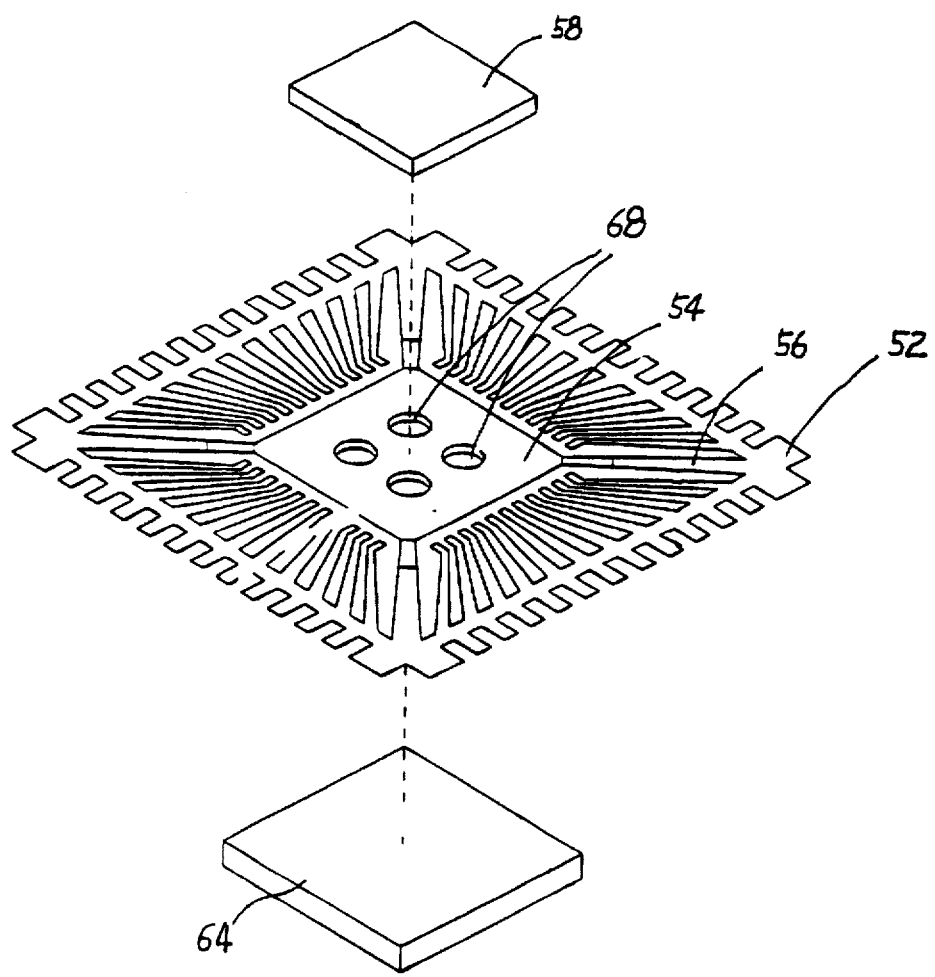
FIG. 4a is an enlarged perspective view of the components shown in FIG. 4 prior to assembly.

Referring initially to FIG. 4, wherein a plastic molded package 50 fabricated by the preferred embodiment of the present invention method is shown. In the process, a lead frame 52 containing a die paddle 54 connected by tie bars 56 is first provided. This is also shown in FIG. 4a in a perspective view of the individual components prior to assembly. The lead frame 52 is made of any one of known materials such as copper or copper alloy. An integrated circuit die 58 having numerous bonding pads 60 on its top surface 62, and a heat sink 64 having a top surface 66 are provided. This type of heat sink is sometimes called a heat spreader. The heat sink 64 is made of a high thermal conductivity material, usually a metal or a metal alloy. Suitable materials that can be used include copper, copper alloys, aluminum, aluminum alloys or any other suitable materials that has high thermal conductivity.

Two or four apertures 68 are provided in the die paddle 54 in the lead frame 52. The apertures 68 should have a diameter that is sufficiently large for an adhesive to flow through without difficulty. A minimum aperture diameter was found to be approximately 1 mm. However, slightly smaller or larger diameters should work equally well in the present invention. It should be noted that the diameters of the apertures and the total numbers of apertures required in a single die paddle can be varied greatly from application to application. For instance, in a large area die paddle for mounting a large integrated circuit die, larger diameters and larger number of apertures such as more than four may be used. On the contrary, in a small die paddle for mounting a small integrated circuit die, only one aperture having a small diameter may be used. The locations of the apertures can be suitably selected such that a maximum bond strength between the IC die and the heat sink can be achieved.

In a die bonding process, the integrated circuit die 58 and the heat sink 64 are bonded together with the die paddle 54 sandwiched therein between by an adhesive 70. The adhesive 70 is preferably an adhesive that has high thermal conductivity and can be cured in a short time to a maximum bond strength. Such adhesive can be of an epoxy loaded with a metal filler such as silver powder. The epoxy adhesive provides a short cure time and a high bond strength while the silver powder greatly improves its thermal conductivity such that heat generated in the integrated circuit die 58 can be readily conducted to the heat sink 64. The die bonding operation may be carried out in a bonding platens (not shown) by applying a pressure thereon to further assure the achievement of a tight bond between the top surface 66 of the heat sink 64 and the bottom surface 72 of the IC die 58. The pressure applied can be suitably selected such that adhesive 70 flows sufficiently to completely fill the holes 68 and to adhere to the top surface 66 of the heat sink 64.

After the die bonding process, bonding wires 74 are provided between the bonding pads 60 situated on the top surface 62 of IC die 58 to the leads (not shown) on lead frame 52. This enables the connection of the IC die 58 to the outside circuit that the plastic molded package 50 is connected to. The number of bonding pads 60 situated on top surface 62 of the die 58 can be numerous and is dependent on the size of the IC die 58. After the completion of the wire bonding, the bonded assembly of the IC die 58, the heat sink 64, and the die paddle 54 in lead frame 52 is placed in an injection mold apparatus and a plastic material 78 is subsequently injected to completely encapsulate and form the plastic molded package 50. The plastic encapsulation protects the various components of die 58, heat sink 64, and lead frame 52 from the service environment and from damages by mechanical force, by moisture, by heat and by chemicals.

Figure 5:
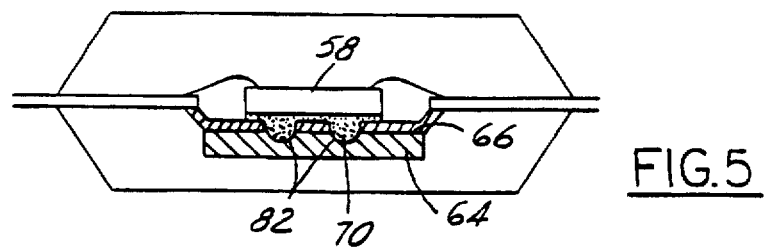
FIG. 5 is an enlarged cross-sectional view of the present invention bonding method in an alternate embodiment.

An alternate embodiment of the present invention is shown in FIG. 5, wherein dimples 82 in a surface 66 of the heat sink 64 are provided. The purpose of the dimples 82 is to further enhance the bonding between the integrated circuit die 58 and the heat sink 64. The adhesive material 70 flows into the dimples 82 to further provide a mechanical lock between the adhesive and the heat sink 64. The dimples 82 are formed of a small recessed area in the top surface 66 of the heat sink 64. In a heat sink having a thickness of 0.8 mm, the depth of the dimples 82 can be approximately 0.2 mm. The dimples should have a curvature of approximately 2.0 mm and without any sharp corners such that no voids between the adhesive 70 and the heat sink 64 can be formed. It should be noted that the depth and the shape of the recessed areas, or dimples 82, can be entirely optional depending on the specific bonding application. For instance, the depth of the dimples can be selected such that adequate bond strength can be obtained. In extreme situations, an undercut (not shown) can be made to achieve maximum bond strength.

Figure 6:
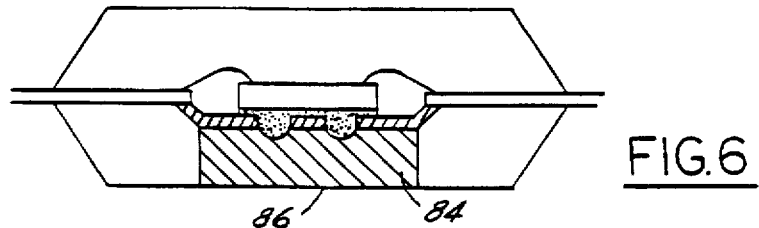
FIG. 6 is an enlarged cross-sectional view of the present invention bonding method in a second alternate embodiment.

In a second alternate embodiment, as shown in FIG. 6, the heat sink 84 has a significantly larger thickness such that the bottom surface 86 of the heat sink is exposed to the ambient after the encapsulation process. This type of heat sink is sometimes called a heat slug. It provides improved heat dissipation by its exposure to the ambient. Its heat dissipation capability can be further improved by connecting to another exterior heat sink (not shown) mechanically attached. This type of heat sink is frequently used in applications that demand maximum heat dissipation such as those with densely packaged IC circuits or those IC dies that consume high power.

Figure 7:
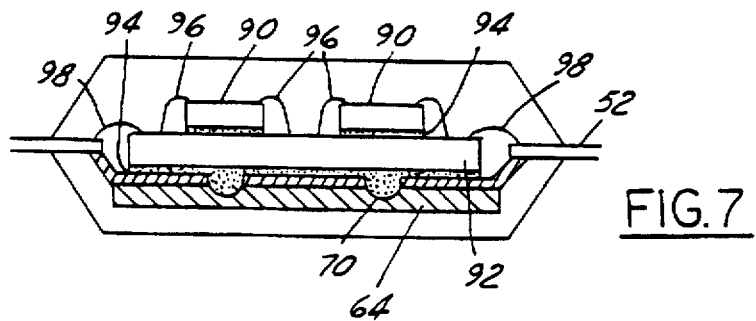
FIG. 7 is an enlarged cross-sectional view of the present invention bonding method in a third alternate embodiment.

In a third alternate embodiment shown in FIG. 7, a multiple number of integrated circuit dies 90 are bonded and encapsulated. In applications where more than one IC die is bonded to a heat sink 64, the substrate 92 are first bonded to the heat sink 64 by an adhesive layer 94. The adhesive 94 can be a similar type of adhesive that is used in bonding the IC dies 90 to the substrate 92. This technique enables the bonding of two or more integrated circuit dies to a single substrate after the substrate is bonded to a heat sink. Bonding wires 96 are connected between the IC dies 90 and the substrate 92 through electrical circuits (not shown). The substrate 92 are then connected by connecting wires 98 to various leads (not shown) on lead frame 52. The method provides greater flexibility to the present invention such that it can be applied in many multiple IC package applications.

While the present invention has been described in an illustrative manner, it should be understood that the terminology used is intended to be in a nature of words of description rather than of limitation.

Furthermore, while the present invention has been described in terms of a preferred and three alternate embodiments thereof, it is to be appreciated that those skilled in the art will readily apply these teachings to other possible variations of the invention.

The embodiments of the invention in which an exclusive property or privilege is claimed are defined as follows:

We claim:

1. A plastic molded package of an integrated circuit, comprising:
   a lead frame containing a die paddle portion, said die paddle portion having a top surface, a bottom surface, and at least one aperture therethrough,
   a heat sink positioned abutting the bottom surface of said die paddle portion,
   an integrated circuit die positioned abutting the top surface of said die paddle portion,
   an adhesive layer situated between and bonding said integrated circuit die, said die paddle portion, and said heat sink together through said at least one aperture in said die paddle portion, and a plastic material encapsulating said integrated circuit die, said lead frame having said die paddle portion, and said heat sink in a plastic molded package.

2. A plastic molded package of an integrated circuit according to claim 1, wherein said heat sink being made of a material selected from the group consisting of Cu, Cu alloys, Al, Al alloys and any other high thermal conductivity metals and alloys.

3. A plastic molded package of an integrated circuit according to claim 1, wherein said adhesive is a dielectric material filled with a metal powder.

4. A plastic molded package of claim 1, wherein said integrated circuit die having a plurality of electrically conductive bond pads formed on a surface of the die that is not abutted to the die paddle portion.

5. A plastic molded package of claim 4, further comprising a plurality of bond wires, each connecting one of the leads on said lead frame to a respective bond pad on the die.

6. A plastic molded package of claim 1, wherein said integrated circuit die comprises a multiple number of dies mounted on a substrate.

7. A plastic molded package of an integrated circuit, comprising:

a lead frame containing a die paddle portion, said die paddle portion having a top surface, a bottom surface, and at least one aperture therethrough, a heat sink positioned abutting the bottom surface of said die paddle portion, having recessed areas in the surface facing said die paddle portion at locations corresponding to the locations of said at least one aperture to enhance bonding of said heat sink and said die paddle portion together, an integrated circuit die positioned abutting the top surface of said die paddle portion, an adhesive layer situated between and bonding said integrated circuit die, said die paddle portion, and said heat sink together through said at least one aperture in said die paddle portion, and a plastic material encapsulating said integrated circuit die, said lead frame having said die paddle portion, and said heat sink in a plastic molded package.

* * * * *